US006359367B1

(12) United States Patent
Sumanaweera et al.

(10) Patent No.: US 6,359,367 B1
(45) Date of Patent: Mar. 19, 2002

(54) MICROMACHINED ULTRASONIC SPIRAL ARRAYS FOR MEDICAL DIAGNOSTIC IMAGING

(75) Inventors: Thilaka S. Sumanaweera, San Jose; Sevig Ayter, Cupertino; John W. Sliwa, Jr., Los Altos, all of CA (US)

(73) Assignee: Acuson Corporation, Mountain View, CA (US)

(*) Notice: Subject to any disclaimer, the term of this patent is extended or adjusted under 35 U.S.C. 154(b) by 0 days.

(21) Appl. No.: 09/455,881

(22) Filed: Dec. 6, 1999

(51) Int. Cl.[7] ............................ H02N 1/00; H01L 41/08

(52) U.S. Cl. ....................... 310/309; 310/306; 310/311; 310/334; 310/3

(58) Field of Search ................................ 310/306, 309, 310/317, 334–336

(56) References Cited

U.S. PATENT DOCUMENTS 3,760,385 A * 9/1973 Bierlein ................ 340/174 YC
4,262,339 A 4/1981 Geary
4,432,007 A 2/1984 Cady
4,452,084 A * 6/1984 Taenzer ....................... 73/609
4,477,892 A * 10/1984 Tosima et al. .......... 310/334 X
5,291,090 A * 3/1994 Dias ........................... 310/334
5,619,476 A 4/1997 Haller et al.
5,793,701 A 8/1998 Wright et al.
5,808,962 A * 9/1998 Steinberg et al. .............. 367/7
5,835,458 A * 11/1998 Bischel et al. ........... 369/44.12
6,102,857 A * 8/2000 Kruger ....................... 600/437

OTHER PUBLICATIONS

Thilaka S. Sumanaweera et al., *A Spiral 2D Phased Array for 3D Imaging*; 1999; pp. 1–4.

H. T. Soh et al.; *Silicon Micromachined Ultrasonic Immersion Transducers*; Dec. 9, 1996; pp. 3674–3676.

R. A. Noble et al; *Novel Silicon Nitride Micromachined Wide Bandwidth Ultrasonic Transducers*; 1998.

I. Ladabaum et al., *Miniature Drumheads; Microfabricated Ultrasonic Transducers*; 1998; pp. 25–29.

X. C. Jin et al., *Micromachined Capacitive Transducer Arrays for Medical Ultrasound Imaging*; 1998.

* cited by examiner

*Primary Examiner*—Mark O. Budd
(74) *Attorney, Agent, or Firm*—Brinks Hofer Gilson & Lione; Craig A. Summerfield

(57) ABSTRACT

Spiral, sparse spiral, substantially spiral or substantially sparse spiral transducer arrays comprising capacitive micromachined ultrasonic transducer elements disposed on a silicon substrate, and ultrasound imaging systems employing same. The transducer elements are respectively coupled to a plurality of amplifiers. Imager electronics are coupled to each of the amplifiers and drives the transducer elements and/or generates an output of the spiral transducer array. The amplifiers may be located in the silicon substrate containing the transducer elements, or on a separate substrate that is interconnected to the substrate containing the transducer elements using bumps, for example. Electrical interconnection to the transducer elements may readily be achieved without interfering with the acoustic output of the transducer elements.

27 Claims, 3 Drawing Sheets

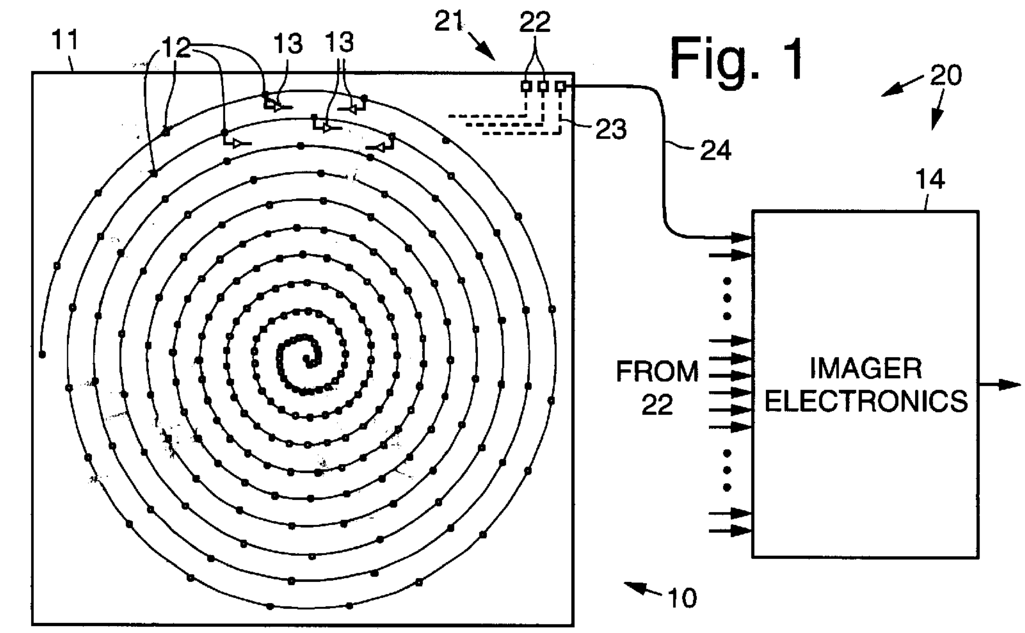
Fig. 1
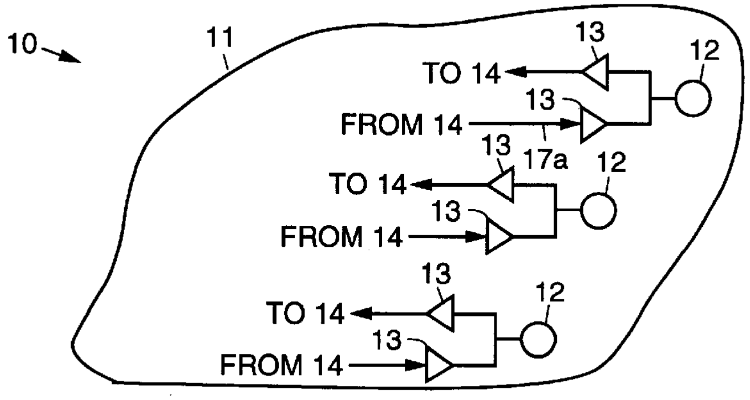
Fig. 2
Fig. 3a
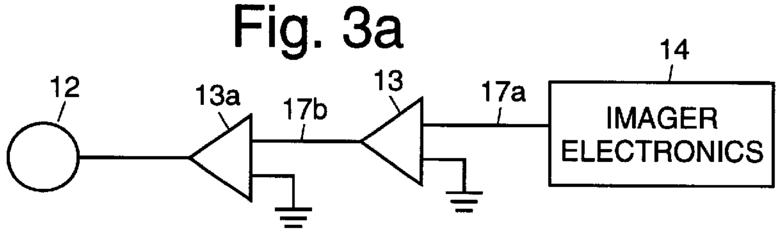
Fig. 3b
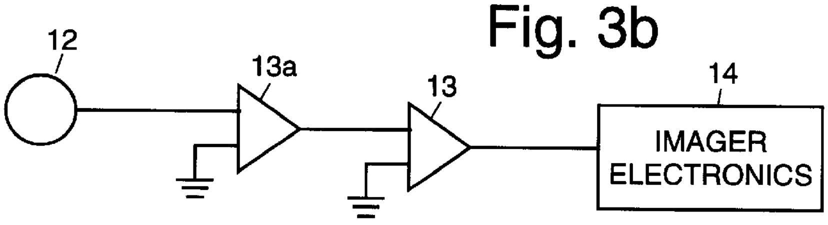

MICROMACHINED ULTRASONIC SPIRAL ARRAYS FOR MEDICAL DIAGNOSTIC IMAGING

BACKGROUND

The present invention relates generally to transducer arrays, and more particularly, to spiral transducer arrays manufactured using micromachining fabrication technologies.

Capacitive micromachined ultrasonic transducers (CMUTs) in particular have been fabricated in this manner. Spiral sparse arrays have been described in various publications, Spiral sparse arrays are discussed in U.S. Pat. No. 5,808,962 entitled "Ultrasparse, Ultrawideband Arrays" and a technical paper by Sumanaweera et al. entitled "A Spiral 2D Phased Array for 3D Imaging" published in the Proceedings of the IEEE International Ultrasonic Symposium, 1999.

Capacitive micromachined ultrasonic transducers (CMUTs) have also been described in various publications. Such transducers are described in U.S. Pat. No. 5,619,476 entitled "Electrostatic Ultrasonic Transducer", U.S. Pat. No. 4,262,339 entitled "Ferroelectric Digital Device", and U.S. Pat. No. 4,432,007 entitled "Ultrasonic Transducer Fabricated as an Integral Part of a Monolithic Integrated Circuit".

Finally, the following papers report the use of micromachining technologies in the fabrication of conventional ultrasound transducer designs: (1) R. A Noble et al., "Novel silicon nitride micromachined wide-bandwidth ultrasonic transducers", presented at the 1998 IEEE International Ultrasonics Symposium in Sendai, Japan, (2) X. C. Jin, "Micromachined capacitive transducer arrays for medical ultrasound imaging", presented at the 1998 IEEE International Ultrasonics Symposium in Sendai, Japan, (3) I. Ladabaum, "Miniature drumheads: microfabricated ultrasonic transducers", Ultrasonics 36 (1998) 25–29, and (4) H. T. Soh, "Silicon micromachined ultrasonic immersion transducers", Appl. Phys. Lett. 69 (24), Dec. 9, 1996.

However, heretofore, the use of micromachining has not been applied to the fabrication of spiral arrays and sparse spiral arrays in particular. Spiral arrays, previously recognized as offering unique beam-forming advantages such as sidelobe elimination, have not been rendered manufacturable using conventional transducer construction methods. Inventors of the present invention recognize the unique abilities of micromachining are now able to solve this problem in advantageous manners disclosed herein.

In the past, conventional two-dimensional arrays (areal arrangements of piezoelements) have been fabricated using piezoelectric ceramic materials such as PZT. Although the typical ceramic PZT materials used in medical ultrasound transducer arrays have a high dielectric constant, the electrical impedance of a small two-dimensional array element is very high. This prevents effective transmission of the transmission pulse signals through the transducer cable without using buffer amplifiers at the probe end of the cable.

In addition, the electrical connection to the small areal piezoelectric ceramic elements is generally done using multilayer flexible circuits, which comprise a layered structure of polymer and metal support materials, typically Kapton™ and copper. Kapton, having a low acoustic impedance, and copper having a high acoustic impedance, form a highly undesirable acoustic loading to the high acoustic impedance piezomaterial. This in effect increases the internal undesired reflections within the transducer and compromises the necessary temporal compactness of the transducer's acoustic output in order to get good axial resolution.

It would be desirable to have a transducer structure wherein electrical connections do not significantly compromise the acoustic signal quality. It would also be desirable to have a transducer structure manufactured using micromachining fabrication techniques and materials that overcome the limitations of conventional arrays. It would also be desirable to have improved ultrasound imaging systems employing such transducer structures.

SUMMARY OF THE INVENTION

The present invention provides for spiral, or substantially spiral, transducer arrays manufactured using micromachining techniques and materials, with the arrays preferably being capacitive micromachined ultrasonic transducer arrays. Capacitive micromachined ultrasonic transducers (CMUTS) have been demonstrated to have sensitivities that are equivalent to piezoelectric ceramic elements.

Before proceeding the terms "micromachining" and "multilayer interconnects" used herein shall be defined.

Micromachining is the formation of microscopic structures using a combination or subset of (A) Patterning tools (generally lithography such as projection-aligners or wafer-steppers), and (B) Deposition tools such as PVD (physical vapor deposition), CVD (chemical vapor deposition), LPCVD (low-pressure chemical vapor deposition), PECVD (plasma chemical vapor deposition), and (C) Etching tools such as wet-chemical etching, plasma-etching, ion-milling, sputter-etching or laser-etching. Micromachining is typically performed on substrates or wafers made of silicon, glass, sapphire or ceramic. Such substrates or wafers are generally very flat and smooth and have lateral dimensions in inches. They are usually processed as groups in cassettes as they travel from process tool to process tool. Each substrate can advantageously (but not necessarily) incorporate numerous copies of the product. There are two generic types of micromachining which we utilize-1) Bulk micromachining wherein the wafer or substrate has large portions of its thickness sculptured, and 2) Surface micromachining wherein the sculpturing is generally limited to the surface-and particularly to thin deposited films on the surface. The micromachining definition used herein includes the use of conventional or known micromachinable materials including silicon, sapphire, glass materials of all types, polymers (such as polyimide), polysilicon, silicon nitride, silicon oxynitride, thin film metals such as aluminum alloys, copper alloys and tungsten, spin-on-glasses (SOGs), implantable or diffused dopants and grown films such as silicon oxides and nitrides.

Multilayer interconnects are defined as including interconnects made in the manner of IC or integrated circuit interconnects or interconnects found on hybrid circuit substrates. More particularly, the transducer embodiments disclosed herein incorporate at least two of the following known items or two instances of one of the known items:

(1) Thin-film interconnect layer such as those deposited by PVD, CVD, LPCVD, electroplating, electroless plating, screen-printing, pattern-forming dispensing techniques or damascene-type CMP or chemical-mechanical-polishing techniques, (2) Diffused interconnect layer or ion-implanted interconnects, (3) Silicide metal-based interconnect layer, (4) Vias or contact through-hole layer as formed by wet-etching, dry plasma etching, laser drilling, chemical photodevelopment of a photosensitive polymer dielectric or screen-printing, (5) Interlayer insulating dielectric layer such as thin-film PECVD glasses, SOGs and spin-on polyimide, and (6) Overcoat layer such as hermetic oxynitride or nitride protective and insulating layers used in combination with one or more of (1–5).

It is to be emphasized that the interconnects and vias may be either (or both) surface features (limited to the surface films as in a typical IC) or bulk features such as through-the-wafer vias and interconnects found in micromachined silicon pressure sensors sold by the millions.

By eliminating conventional fabrication processes and using micromachined processes and materials, the inventors of the present invention even more importantly realized that the difficult interconnection routing problem inherent to spiral arrays can be solved in addition to getting rid of the above impedance mismatch problems. Micromachining technologies are utilized for the fabrication of acoustic elements and related IC multilayer interconnection technologies to also solve the interconnection routing problem among those elements and their supporting electronics. Specific arrangements of such multilayer interconnects are described in support of micromachined spiral arrays and sparse spiral arrays.

The batch fabrication techniques and constructions described herein eliminate the exceedingly difficult and expensive challenge of trying to use unsuitable conventional technologies to bring spiral arrays to product fruition.

An exemplary spiral sparse array comprises a silicon substrate or wafer further comprising a spiral array, or substantially spiral arrays, of capacitive micromachined ultrasonic transducer elements (CMUTs). The capacitive micromachined ultrasonic transducer elements may specifically be disposed in the shape of an exponential spiral, for example. The capacitive micromachined ultrasonic transducer elements (vibratable membranes typically) may be inexpensively batch-manufactured using the well-established silicon micromachining manufacturing technologies whose typical steps are outlined in the above items (A)–(C) widely known to the art; for example in the current micromachined accelerometer markets and pressure-sensor markets. Batch fabrication of micromachined arrays will all for inexpensive disposable transducers.

Further, multilayer interconnection technologies described in items (1)–(6) above are utilized to enable solving of the spiral array interconnect problem by incorporating sufficient interconnect layers to allow interconnect routing within the areal outline of the array itself. Such interconnection technologies are widely known in the IC art and hybrid circuit art.

Specifically, preferred arrangements utilizing at least two interconnect layers and at least one contact (via) layer serving the spiral elements and their associated circuitry are envisioned. The two or more layers may be entirely in the surface films of the array (i.e., surface micromachining and interconnection) or may include through-substrate vias or interconnects (i.e., bulk micromachined devices such as pressure sensors and accelerometers).

A preferred embodiment of the invention is the combination of multilayer interconnect and micromachining as applied to solving the spiral array manufacturability issue.

A plurality of amplifiers are preferably individually coupled to each transducer element of the spiral array. The electronics of the imaging system is coupled to each of the amplifiers and thereby allows generation of acoustic output (or acoustic reception as desired) from the substantially spiral sparse array. The plurality of amplifiers overcomes the electrical impedance mismatch between the CMUT transducer-membrane elements and the electronics of the imager. The use of multilevel interconnection technologies allows the amplifiers (or other per-element circuitry) to be cointegrated in or on the same substrate as the array elements themselves.

An additional embodiment mates the amplifiers (or other per-element electronic circuits) by using ball-grid array interconnects (BGAs) to connect an array chip to a juxtaposed and aligned circuitry chip. This embodiment allows the array and its electronics to be separately yieldable as subcomponents.

Another embodiment also utilizes a separately made array chip and circuitry chip, but instead of face-to-face BGA interconnects, the interconnection is done generally laterally using thin or thick film interconnects in the manner of known multichip modules or multichip hybrids.

In the case of a substrate comprising a silicon wafer or a silicon-coated wafer (or other semiconductor material), the supporting per-element circuitry for the array may comprise integrated circuitry formed in said silicon in the conventional manner. The array acoustic elements may be formed using micromachining processes practiced on the substrate before, during or after the IC formation processes as is widely known in the art. In any design, the circuitry, if incorporated on the same chip as the acoustic elements, is located such that it does not block the acoustic propagation path. (e.g., circuitry under the elements or beside the elements, for example).

It is important to note that although CMUTs are the preferred elements, one may also utilize other micromembrane-based micromachined elements. Such alternatives include piezo-film coated micromembrane PMUT) whose vibration is excited (or sensed) instead by the electrically-driven piezofilm coating on the membranes.

BRIEF DESCRIPTION OF THE DRAWINGS

The various features and advantages of the present invention may be more readily understood with reference to the following detailed description taken in conjunction with the accompanying drawings wherein like reference numerals designate like structural elements, and in which:

FIG. 1 illustrates a top schematic view of an ultrasound system having a spiral transducer array in accordance with the principles of the present invention incorporating the preferred capacitive micromachined ultrasonic transducer (CMUT) elements;

FIG. 2 is an enlarged view of a portion of FIG. 1 illustrating an exemplary spiral transducer array having a single substrate containing the cointegrated transducer elements amplifiers;

FIGS. 3*a* and 3*b* illustrate operation of transmit and receive modes of the ultrasound system shown in FIG. 1;

FIG. 4*b* illustrates a side view of the spiral array shown in FIG. 4*a.

DETAILED DESCRIPTION

Figure 4A:
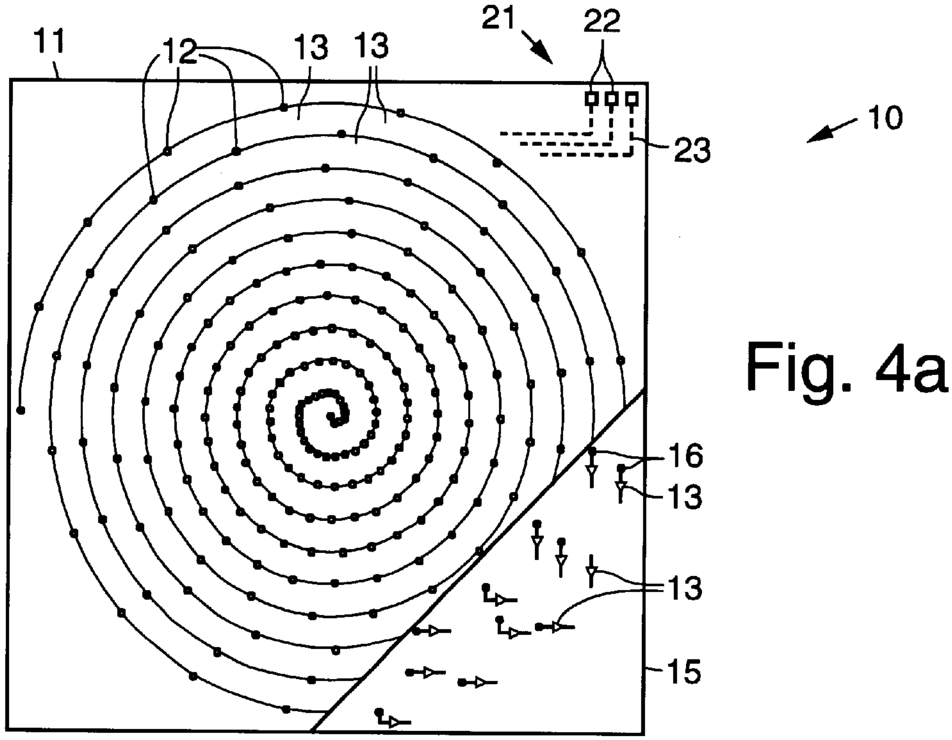
FIG. 4*a* illustrates a partially cutaway side view of an exemplary spiral array having separate interconnected transducer and amplifier substrates.

Referring to the drawing figures, FIG. 1 illustrates a top schematic view of an ultrasound system 20 comprising an acoustic transducer 10 comprising a spiral transducer array 10 in accordance with the principles of the present invention that incorporates micromachined transducer elements 12 which are preferentially capacitive micromachined ultrasonic transducers (CMUTs) 12. The spiral transducer array 10 preferably comprises a silicon substrate 11, or semiconductor-material incorporating wafer 11, in or on which are formed a plurality of capacitive micromachined ultrasonic transducer elements 12.

The substrate 11 may comprise bulk silicon. The substrate 11 may also be selected from a group consisting of bulk glass, sapphire, quartz, semiconductor or ceramic material, wherein the micromachined acoustic elements 12 preferably comprise surface micromachinable films.

Generally, the micromachined acoustic elements 12 are either (or both) surface micromachinable elements or bulk micromachinable elements, and comprise capacitively driven capacitive micromachined ultrasonic transducers, or otherwise acoustically-excitable membranes. Acoustically-excitable membranes may each be driven by a coupled piezofilm (PMUT), for example.

The substantially spiral pattern of micromachined acoustic elements 12 is preferably defined by a monotonic function in polar coordinates. The micromachined acoustic elements 12 are preferably located along the substantially spiral pattern with a goodness of fit, $Q>10^{-6}$, where Q is the chi-square chance probability.

More specifically, the transducer elements 12 of the spiral transducer array 10 are preferably disposed along a spiral path formed on the substrate 11, such as on an exponential spiral path illustrated in FIG. 1. A spiral is a two-dimensional planar curve definable using polar coordinates, $(\theta, r)$, $(0<\theta<\theta_{max})$ as:

$$r=f(\theta),$$

where, $\theta_{max}$ is an upper bound of $\theta$ and f is a non-negative single-valued function such that $f(\theta+2\pi)>f(\theta)$ for all $0\leqq\theta\leqq\theta_{max}$. This general definition includes Archimedian spirals, exponential spirals, equiangular spirals and elliptical spirals, among others. The transducer elements 12 may or may not lie on the spiral curve perfectly. The transducer elements may be distributed around a spiral such that the spiral approximates the element locations in a least squares sense or a substantially least squares sense.

The micromachined acoustic elements 12 may be disposed at substantially equally spaced locations along the length of the substantially spiral pattern such that all equally spaced locations comprise an element. Alternatively, the micromachined acoustic elements 12 may be disposed at unequally spaced locations along the length of the substantially spiral pattern. A transducer may incorporate one (or more) spirals of the same (or different) design fabricated on one (or more) substrate 11. A given substrate 11 may also, as is done in batch fabrication, be one of many identical (or different) spirals wherein a large substrate with many spirals is subdivided after manufacture.

Active acoustic elements 12 may alternatively be selectively determined by switching on a substantially spiral subset of elements 12 arranged in a grid pattern. The grid pattern of switchable elements 12 allows for multiple different substantially spiral configurations or subsets.

The capacitive transducer elements 12 (less the required and herein taught interconnects) may be inexpensively manufactured using well-established silicon micromachining technology. For example, the capacitive transducer elements 12 may be manufactured in accordance with the teachings of U.S. Pat. No. 5,619,476 entitled "Electrostatic Ultrasonic Transducer", or U.S. Pat. No. 4,432,007 entitled "Ultrasonic Transducer Fabricated as an Integral Part of a Monolithic Integrated Circuit", for example, cited in the Background section.

A plurality of amplifiers 13 are preferably coupled to each transducer element 12 of the spiral transducer array 10. The plurality of amplifiers 13 are also coupled to imager electronics 14. The plurality of amplifiers 13 are selectively interconnected to amplify signals derived from the imager electronics 14 and the transducer elements 12 when the array 10 is used in transmit mode and receive mode. This is illustrated more clearly in FIG. 2. The plurality of amplifiers 13 may be manufactured using well-established silicon IC manufacturing technology.

The amplifiers 13 may be located within the silicon substrate 11 containing the capacitive transducer elements 12 (FIG. 1), or on a separate silicon amplifier substrate 15 (FIG. 4*a*) or wafer 15 that is interconnected to the silicon substrate 11 or wafer 11 containing the capacitive transducer elements 12. The amplifiers 13 may underlie the acoustic elements 12 or may be disposed adjacent to and interspersed with the acoustic elements 12.

Referring to FIG. 2, it shows an enlarged view of a portion of FIG. 1 illustrating an exemplary spiral transducer array 10 having a single silicon substrate 11 containing the capacitive transducer elements 12 and amplifiers 13. The electrical connection to the transducer elements 12 may be carried out on the silicon substrate 11 containing the capacitive transducer elements 12 without interfering with the acoustic output of the capacitive transducer elements 12 as by routing the interconnects such as 21 under or around the acoustic elements 12.

In transmit mode, the plurality of amplifiers 13 may amplify pulses generated by the imager electronics 14 and drive the transducer elements 12. In receive mode, the plurality of amplifiers 13 may amplify signals derived from the transducer elements 12 that are input to the imager electronics 14 to generate an output signal from the spiral transducer array 10.

The electrical impedance of a transmission line 17*a* between the amplifiers 13 and the imager electronics 14 may be set at a value such as 50 ohms. The plurality of amplifiers 13 overcome the electrical impedance mismatch between the capacitive transducer elements 12 and the imager electronics 14.

The substrate 11 or wafer 11 illustrated in FIG. 1 is also shown incorporating multilevel interconnects 21 comprising pads 22 connected to the amplifiers 13 by conductors 23 partially shown in dashed lines). The multilevel interconnects 21 allow routing of electrical signals (or sources) from each transducer element 12 (or from each element/amplifier pair 12, 13) to the imager electronics 14. By way of example, multilevel interconnects 20 include the following.

(1) Interconnects 21 that couple each element 12 or element/amplifier pair 12, 13 to a matching wirebond pad 22 or tape-automated bonding (TAB) pad 22 generally located at the edge(s) of substrate 11. The imager electronics 14 may connect to these pads 22 via off-board connections 24 such as interconnects 24.

(2) Interconnects 21 similar to (1) but the interconnects 21 pass through the substrate 11 using vias or contact holes such that most or all of the interconnect routing is done on the backside of the substrate 11 (option not shown, but the pads 22 and most of the interconnects 21 would likely be on the bottom of the substrate 11 completely avoiding the routing challenge around the spiral.

Figure 4B:
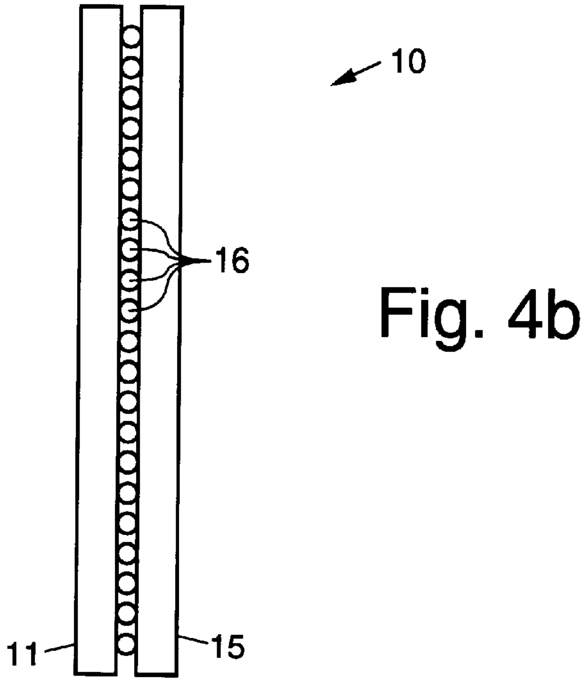

(3) Interconnects 21 similar to (2) but wherein some per-element circuits (e.g., amplifiers 13, switches, etc.)

are situated instead (or in addition) on a separate circuit chip 15 or substrate 15 and the array substrate 11 and the circuit chip 15 are bonded (interconnected) face-to-face using ball-grid-array-like techniques (FIGS. 4*a* and 4*b*).

Alternatively, the plurality of amplifiers 13 may be coupled to a second plurality of amplifiers 13*a* shown in FIGS. 3*a* and 3*b*. Details regarding interconnection of the first and second pluralities of amplifiers 13, 13*a* and the transducer elements 12 are shown in FIGS. 3*a* and 3*b*. FIGS. 3*a* and 3*b* also illustrate operation of transmit and receive modes of the ultrasound system 20 shown in FIG. 1. The imager electronics 14 is coupled to one of the amplifiers 13 by means of a first (50 ohm) transmission line 17*a*. The two amplifiers 13, 13*a* are interconnected by way of a second (200 ohm) transmission line 17*b*.

The electrical impedances of a transmission line 17*b* between the two pluralities of amplifiers 13, 13*a* could then be a value other than 50 ohms, such as 200 ohms, for example. This segment of the transmission line 17*b* may be within the substrate 11 and/or between two substrates 11, 15. The output of the second plurality of amplifiers 13*a* are then connected to the imager electronics 14 via a transmission line 17*a* with an electrical impedance such as 50 ohms, for example. This segment of the transmission line 17*a* may be implemented using a cable. This two step buffering process using two amplifiers 13, 13*a* can yield better signal coupling between the transducer elements 12 and the imager electronics 14.

Referring now to FIG. 4*a*, it illustrates a partially cutaway side view of an exemplary spiral transducer array 10 having a transducer substrate 11 and a joined amplifier substrate 15. FIG. 4*b* illustrates a side view of the spiral array shown in FIG. 4*a*. The transducer substrate 11 contains a spiral array of transducer elements 12, and the amplifier substrate 15 contains a plurality of amplifiers 13. Electrical face-to-face interconnection between the transducer array chip 11 and the amplifier chip 15 or substrate 15 is preferably implemented using bump interconnects 16 or ball-grid array interconnects (BGAs) 16, for example.

The use of the terms BGA or bump interconnect 16 herein is meant to include all ways of forming bridging areally arranged interfacial interconnects. The most widely used ball grid array process involves reflowed screen-printed solder bumps 16. However, using other known technologies, one may form bridging bumps 16 via plating, electroforming, individual microsphere placement, or wire bonding. Reflowed solder bumps 16 are shown in FIG. 4*b*.

It is recognized that, in order to acoustically isolate elements laterally, polymer-filled trenches or laser-etched trenches (not shown) may be beneficially formed between elements 12 in the surface of substrate 11. Such acoustic isolation may be total in that the trenches mechanically substantially isolate elements 12 from each other as much as interconnection needs allow. There are a number of well-known trenching techniques that may be used to accomplish this isolation.

It is also recognized that one may choose materials and shapes for the bumps 16 that beneficially further reduce acoustic ringing and enhance acoustic attenuation of backward travelling acoustic waves such as those generated during transmit. For example silver-filled epoxy bumps attenuate more than solder reflowed bumps 16. Finally, the interfacial gap between substrates 11, 15 in which ball-grid array interconnects 16 are located may also be backfilled with a polymeric material which further provides desirable impedance and attenuation properties for the overall structure.

Figure 5:
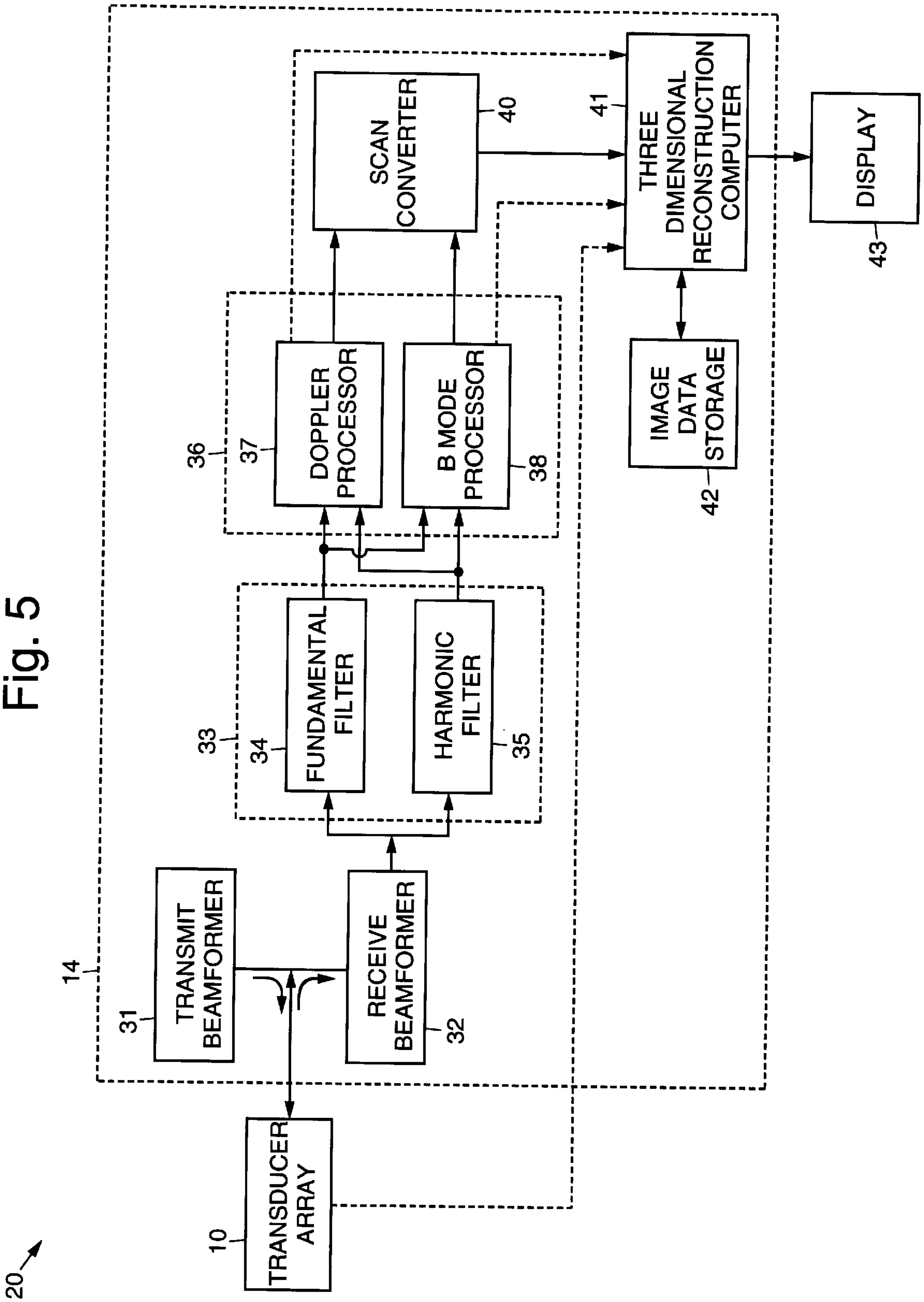
* and FIG. 5 illustrates an exemplary ultrasound system in accordance with the principles of the present invention.

Referring to FIG. 5, an exemplary ultrasound system 20 is generally shown that incorporates a spiral transducer array 10 in accordance with the principles of the present invention. The ultrasound system 20 includes the transducer array 10 which is coupled to the imager electronics 14. The imager electronics 14 is coupled to a display 43 for displaying an ultrasound image.

The imager electronics 14 comprises a transmit beamformer 31 and a receive beamformer 32 coupled to the transducer array 10. A filter block 33, comprising a fundamental brand filter 34 and harmonic band filter 35, is coupled to the receive beamformer 32. A signal processor 36, comprising a Doppler processor 37 and a B mode processor 38, is coupled to the filter block 33. Outputs of the fundamental filter 34 and harmonic filter 35 are each coupled to the Doppler processor 37 and the B mode processor 38. A scan converter 40 is coupled to outputs of the Doppler processor 37 and B mode processor 38. An image data storage 42 is coupled to a three-dimensional reconstruction computer 41, along with outputs of the scan converter 40. Optionally the transducer array 10, the Doppler processor 37, and the B mode processor 38 are coupled to the three-dimensional reconstruction computer 41 which generates a three-dimensional image. The display 43 is coupled to the three-dimensional reconstruction computer 41 for displaying a reconstructed ultrasound image.

The exemplary ultrasound system 20 is configurable to acquire information corresponding to a plurality of two-dimensional representations or image planes of a subject for generating a three-dimensional image. Alternatively, it can also acquire three-dimensional images directly by firing a multitude of ultrasound lines filling the three-dimensional space. Other systems, such as those for acquiring data with a two dimensional, 1.5 dimensional or a single element transducer array, may be used. To generate three-dimensional representations of a subject during an imaging session, the ultrasound system 20 is configured to transmit, receive and process during a plurality of transmit events. Each transmit event corresponds to firing one or more ultrasound scan lines into the subject.

The transmit beamformer 31 is constructed in a manner known in the art, and may be a digital or analog based beamformer 31 capable of generating signals at different frequencies. The transmit beamformer 31 generates one or more excitation signals. Each excitation signal has an associated center frequency. As used herein, the center frequency represents the frequency in a band of frequencies approximately corresponding to the center of the amplitude distribution. Preferably, the center frequency of the excitation signals is within a 1 to 15 MHz range, such as 2 MHz, for example, and accounts for the frequency response of the transducer array 10. The excitation signals preferably have non-zero bandwidth.

Control signals are provided to the transmit beamformer 31 and the receive beamformer 32. The transmit beamformer 31 is caused to fire one or more acoustic lines in each transmit event, and the receive beamformer 32 is caused to generate in-phase and quadrature (I and Q) information along one or more scan lines. Alternatively, real value signals may be generated. A complete two-dimensional or three-dimensional data set (a plurality of scan lines) is preferably acquired before information for the next data set is acquired.

Upon the firing of one or more ultrasound scan lines into the subject, some of the acoustical energy is reflected back to the transducer array 10. In addition to receiving signals at the fundamental frequency (i.e., the same frequency as that transmitted), the nonlinear characteristics of tissue or optional contrast agents also produce responses at harmonic frequencies. Harmonic frequencies are frequencies associated with nonlinear propagation or scattering of transmit signals.

As used herein, harmonic includes subharmonics and fractional harmonics as well as second, third, fourth, and other higher harmonics. Fundamental frequencies are frequencies corresponding to linear propagation and scattering of the transmit signals of the first harmonic. Nonlinear propagation or scattering corresponds to shifting energy associated with a frequency or frequencies to another frequency or frequencies. The harmonic frequency band may overlap the fundamental frequency band.

The filter block 33 passes information associated with a desired frequency band, such as the fundamental band using fundamental band filter 34 or a harmonic frequency band using the harmonic band filter 35. The filter block 33 may be included as part of the receive beamformer 32z. Furthermore, the fundamental band filter 34 and the harmonic band filter 35 preferably comprise one filter that is programmable to pass different frequency bands, such as the fundamental, second or third harmonic bands.

For example, the filter block 33 demodulates the summed signals to baseband. The demodulation frequency is selected in response to the fundamental center frequency or another frequency, such as a second harmonic center frequency. For example, the transmitted ultrasonic waveforms are transmitted at a 2 MHz center frequency. The summed signals are then demodulated by shifting by either the fundamental 2 MHz or the second harmonic 4 MHz center frequencies to baseband (the demodulation frequency). Other center frequencies may be used.

Signals associated with frequencies other than near baseband are removed by low pass filtering. As an alternative or in addition to demodulation, the filter block 33 provides band pass filtering. The signals are demodulated to an intermediate frequency (IF) ( e.g., 2 MHz) or not demodulated and a band pass filter is used. Thus, signals associated with frequencies other than a range of frequencies centered around the desired frequency or an intermediate frequency) are filtered from the summed signals. The demodulated or filtered signal is passed to the signal processor 36 as the complex I and Q signal, but other types of signals, such as real value signals, may be passed.

By selectively filtering which frequencies are received and processed, the ultrasound system 20 produces images with varying characteristics. In tissue harmonic imaging, no additional contrast agent is added to the target, and only the nonlinear characteristics of the tissue are relied on to create the ultrasonic image. Medical ultrasound imaging is typically conducted in a discrete imaging session for a given subject at a given time. For example, an imaging session can be limited to a patient examination of a specific tissue of interest over a period of ¼ to 1 hour, although other durations are possible. In this case, no contrast agent is introduced into the tissue at any time during the imaging session.

Tissue harmonic images provide a particularly high spatial resolution and often possess improved contrast resolution characteristics. In particular, there is often less clutter in the near field. Additionally, because the transmit beam is generated using the fundamental frequency, the transmit beam profile is less distorted by a specific level of tissue-related phase aberration than a profile of a transmit beam formed using signals transmitted directly at the second harmonic.

The harmonic imaging technique described above may be used for both tissue and contrast agent harmonic imaging. In contrast agent harmonic imaging, any one of a number of well known nonlinear ultrasound contrast agents, such as micro-spheres or an FS069 agent by Schering of Germany, are added to the target or subject in order to enhance the nonlinear response of the tissue or fluid. The contrast agents radiate ultrasonic energy at harmonics of an insonifying energy at fundamental frequencies.

The signal processor 36 comprises one or more processors for generating two-dimensional Doppler or B-mode information. For example, a B-mode image, a color Doppler velocity image (CDV), a color Doppler energy image (CDE), a Doppler tissue image (DTI), a color Doppler variance image, or combinations thereof may be selected by a user. The signal process 36 detects the appropriate information for the selected image.

Preferably, the signal processor 36 comprises a Doppler processor 37 and a B-mode processor 38. Each of the processors, 37, 38 is preferably a digital signal processor and operates as known in the art to detect information. As is known in the art, the Doppler processor 37 estimates velocity, variance of velocity and energy from the I and Q signals. As known in the art, the B-mode processor 38 generates information representing the intensity of the echo signal associated with the I and Q signals.

The information generated by the signal processor 36 is provided to the scan converter 40. Alternatively, the scan converter 40 includes detection steps as is known in the art and described in U.S. Pat. No. 5,793,701, issued Aug. 11, 1998, entitled. "Method and apparatus for coherent image formation" assigned to the assignee of the present invention. The scan converter 40 is constructed in a manner known in the art to arrange the output of the signal processor 36 into two- or three-dimensional representations of image data. Preferably, the scan converter 40 outputs formatted video image data frames, using a format such as the DICOM medical industry image standard format or a TIFF format.

Thus, the two- or three-dimensional representations are generated. Each of the representations corresponds to a receive center frequency, such as a second harmonic center frequency, a type of imaging, such as B-mode, and positional information. The harmonic based representations may have better resolution and less clutter than fundamental images. By suppressing the harmonic content of the excitation signal, the benefits of harmonic imaging of tissue may be increased.

The plurality of two- or three-dimensional representations of the subject are stored in the image data storage 42. The three-dimensional reconstruction computer 41 operates on the stored plurality of two- or three-dimensional representations and assembles them into a three-dimensional representation. Alternatively, the three-dimensional reconstruction computer 41 may also input pre-scan converted acoustic data to convert to three-dimensional data sets as well. The completed three-dimensional reconstruction is then displayed on the display 43.

Thus, improved ultrasound imaging systems and substantially-spiral transducer arrays manufactured using micromachining fabrication techniques have been disclosed. It is to be understood that the described embodiments are merely illustrative of some of the many specific embodiments that represent applications of the principles of the present invention. Clearly, numerous and other arrangements can be readily devised by those skilled in the art without departing from the scope of the invention.

What is claimed is:

1. An acoustic transducer comprising:

a substrate incorporating a plurality of acoustic elements that at least in part comprise micromachinable material disposed in a substantially spiral pattern on the substrate; and a plurality of interconnections routed to the plurality of acoustic elements, wherein the acoustic elements at least in part comprise capacitively driven capacitive micromachined ultrasonic transducers.

2. The acoustic transducer recited in claim 1 wherein the substrate comprises bulk silicon.

3. The acoustic transducer recited in claim 1 wherein the substrate is selected from a group consisting of bulk glass, sapphire, quartz, semiconductor or ceramic material and the acoustic elements at least in part comprise surface micromachinable film.

4. The acoustic transducer recited in claim 1 wherein the acoustic elements at least in part comprise surface micromachinable elements.

5. The acoustic transducer recited in claim 1 wherein the acoustic elements at least in part comprise bulk micromachinable elements.

6. The acoustic transducer recited in claim 1 wherein the acoustic elements at least in part comprise acoustically excitable membranes.

7. The acoustic transducer recited in claim 6 wherein the acoustically excitable membranes are each excited by a coupled piezofilm.

8. The acoustic transducer recited in claim 1 wherein the substantially spiral pattern of acoustic elements defined by a monotonic function in polar coordinates.

9. The acoustic transducer recited in claim 8 wherein the substantially spiral pattern of acoustic elements are located with a goodness of fit, $Q>10^{-6}$, where Q is the chi-square chance probability.

10. The acoustic transducer recited in claim 1 wherein the substantially spiral pattern of acoustic elements are disposed at substantially equally spaced locations along the length of the spiral and all equally spaced locations comprise an element.

11. The acoustic transducer recited in claim 1 wherein the substantially spiral pattern of acoustic elements are disposed at unequally spaced locations along the length of the spiral.

12. The acoustic transducer recited in claim 1 wherein active acoustic elements are selectively determined by selectively activating or switching on a substantially spiral subset of available elements arranged in a grid pattern.

13. The acoustic transducer recited in claim 12 wherein the grid pattern of activatable elements allows for multiple different substantially spiral configurations.

14. The acoustic transducer recited in claim 1 further comprising a plurality of cointegrated amplifiers.

15. The acoustic transducer recited in claim 14 wherein the plurality of amplifiers are respectively coupled to individual acoustic elements.

16. The acoustic transducer recited in claim 14 wherein the amplifiers underlie the acoustic elements.

17. The acoustic transducer recited in claim 14 wherein the amplifiers are disposed adjacent to and are interspersed with the acoustic elements.

18. The acoustic transducer recited in claim 14 wherein the amplifiers are formed in the substrate.

19. The acoustic transducer recited in claim 14 wherein the amplifiers are formed in on a second independent substrate that is electrically coupled to the acoustic element substrate.

20. The acoustic transducer recited in claim 19 wherein the amplifier substrate is at least electrically coupled to the acoustic element substrate using interfacial bump interconnects.

21. The acoustic transducer recited in claim 19 wherein the amplifier substrate is electrically coupled to the acoustic element substrate using ball-grid array interconnects.

22. The acoustic transducer recited in claim 1 wherein the multiple spiral transducers are fabricated together in a batch process on a common substrate which is subdivided to provide individual spiral transducers.

23. The acoustic transducer recited in claim 1 wherein multiple spiral transducers of different designs are fabricated together in a batch process on a common substrate which is subdivided to provide individual spiral transducers of different design.

24. The acoustic transducer recited in claim 1 which is disposable.

25. An ultrasound imaging system comprising:

an acoustic transducer including a substrate incorporating a plurality of acoustic elements that at least in part comprise micromachinable material disposed in a substantially spiral pattern on the substrate, and a plurality of interconnections routed to the plurality of acoustic elements, wherein the acoustic elements at least in part comprise capacitively driven capacitive micromachined ultrasonic transducers;

imager electronics electrically coupled to the plurality of micromachined acoustic elements of the acoustic transducer for generating an ultrasound image; and a display coupled to the imager electronics for displaying an ultrasound image.

26. The imaging system recited in claim 25 wherein the imager electronics comprises:

a transmit beamformer coupled to the transducer array;

a receive beamformer coupled to the transducer array;

a filter block, comprising a fundamental band filter and harmonic band filter, coupled to the receive beamformer;

a signal processor, comprising a Doppler processor and a B mode processor, coupled to the filter block;

a scan converter coupled to outputs of the Doppler processor and B mode processor;

a three-dimensional reconstruction computer coupled to the scan converter; and an image data storage coupled to the three-dimensional reconstruction computer.

27. The imaging system recited in claim 26 wherein the transducer array, the Doppler processor, and the B mode processor are coupled to the three-dimensional reconstruction computer which receives data therefrom and reconstructs a three-dimensional image.

* * * * *